(12) United States Patent
Tarakji (10) Patent No.: US 9,741,857 B2
(45) Date of Patent: Aug. 22, 2017

(54) APPROACH FOR AN AREA-EFFICIENT AND SCALABLE CMOS PERFORMANCE BASED ON ADVANCED SILICON-ON-INSULATOR (SOI), SILICON-ON-SAPPHIRE (SOS) AND SILICON-ON-NOTHING (SON) TECHNOLOGIES

(71) Applicant: Ahmad Tarakji, San Diego, CA (US)

(72) Inventor: Ahmad Tarakji, San Diego, CA (US)

( * ) Notice: Subject to any disclaimer, the term of this patent is extended or adjusted under 35 U.S.C. 154(b) by 0 days.

(21) Appl. No.: 14/821,685

(22) Filed: Aug. 7, 2015

(65) Prior Publication Data

US 2017/0040461 A1    Feb. 9, 2017

(51) Int. Cl.
| | | |
|---|---|---|
| *H01L 29/786* | (2006.01) | |
| *H01L 29/78* | (2006.01) | |
| *H01L 27/12* | (2006.01) | |

(52) U.S. Cl.
CPC .... *H01L 29/78615* (2013.01); *H01L 27/1203* (2013.01); *H01L 29/7838* (2013.01); *H01L 29/78603* (2013.01); *H01L 29/78696* (2013.01)

(58) Field of Classification Search
CPC ........... H01L 27/1203; H01L 29/78615; H01L 29/7838; H01L 29/78603; H01L 29/78696
See application file for complete search history.

(56) References Cited

U.S. PATENT DOCUMENTS

| | | | |
|---|---|---|---|
| 5,185,280 A | | 2/1993 | Houston et al. |
| 5,841,170 A | * | 11/1998 | Adan ................ H01L 29/78696 257/335 |
| 6,090,648 A | * | 7/2000 | Reedy ..................... H01L 21/86 257/E21.004 |
| 6,204,534 B1 | * | 3/2001 | Adan ................... H01L 27/1203 257/347 |
| 6,732,334 B2 | * | 5/2004 | Nakatsuka .......... H01L 27/0207 716/50 |

(Continued)

OTHER PUBLICATIONS

Vandana B., "Study of Floating Body Effect in SOI Technology, International Journal of Modern Engineering Research", vol. 3, iss. 3, pp. 1817-1824, Jun. 2013.

(Continued)

*Primary Examiner* — Michael Zarroli (57) ABSTRACT

New, distinct, and useful architectures for single-legged SOI-MOS were established and fabricated for the very first time. They incorporated into their architectures an innovative new configuration to wire the device Body to the Body-Tied-Source. This new configuration drastically increased the conductance between the Body and the Body-Tied-Source. This consequently allowed these devices to effectively support much higher operating biases. Same configuration also functioned on structures with very large peripheries. These gave proportional increase in this same conductivity, and for same area-efficiency, with the increase of their peripheries to accommodate higher currents. The functional model that governs this proportional scaling in these new architectures for single-legged SOI-MOS devices was established and is being claimed through this patent for the very first time. Through it, single-legged SOI-MOS devices will efficiently scale to area-efficient ultra large peripheries with minimal hits to their bandwidth.

1 Claim, 9 Drawing Sheets

(56) References Cited

U.S. PATENT DOCUMENTS

2009/0280582 A1* 11/2009 Thijs .................. H01L 27/0248
438/14

OTHER PUBLICATIONS

Ted Johansson et al., "A Review of Watt-level CMOS RF power amplifiers", IEEE Trans. Microw. Theo and Tech., vol. 62, iss. 1, pp. 111-124, Dec. 2013.
Kwangseok Han et al., "RF Characteristics of 0.18-μm CMOS Transistors", Journ. Korea. Phys. Soc. vol. 40, No. 1, pp. 45-48, Jan. 2002.
Jean-Pierre Raskin, "SOI Technology: An Opportunity for RF Designers?", Journal of Telecommunications and Information Technology, No. 4, pp. 3-17, Apr. 2009.
J. Borremans et al., "Perspective of RF Design in Future Planar and FINFET CMOS" Radio Frequency Integrated Circuits Symposium, pp. 75-78, Atlanta GA, 2008.

K.Hirose et al., "Analysis of Body-Tie Effects on SEU Resistance of Advanced FD-SOI SRAMs Through Mixed-Mode 3-D Simulations", IEEE Trans. Nuc. Sc., vol. 51, No. 6, Dec. 2004.
Arash Daghighi et al., "An area efficient body contact for low and high voltage SOI MOSFET devices", Solid-State Elec., vol. 52, iss. 2, pp. 196-204, Feb. 2008.
X. Gu et al., "A Surface-Potential-Based Extrinsic Compact MOSFET Model", Tech. Proceed. 2003 Nanotech. Conf. and Trade Show, vol. 2, pp. 364-367, San Francisco., Feb. 2003.
Hwyro-Kyu Lim et al., Threshold voltage of thin-film Silicon-On-Insulator (SOI) MOSFET's, IEEE Trans. Elec. Dev., vol. 30, No. 10, pp. 1244-1251, Oct. 1983.
Kwyro Lee, Michael Shur, Tor A. Fjeldly, and Trond Ytterdal, Semiconductor Device Modeling for VLSI, New Jersey, Prentice Hall, pp. 238-256, 1993.
Bin Y et al., "Short-channel effect improved by lateral Engineering in deep-submicrometer mosfet's", IEEE Tran. Elec. Dev., vol. 44, No. 4, pp. 627-634, Apr. 1997.
Streetman, Solid State Electronic Devices, 4th ed. New Jersey: Prentice Hall, pp. 244-247, 1995.

* cited by examiner

FIG. 1

FIG. 2 A $$\sigma\_Pocket \cong (q \times \mu_h \times NA) \times \frac{Wp \times tsi \times 2}{SPAC}$$

- WGeff = 2xNxSPAC/2
- N = 4; N is the number of BTs stripes

FIG. 5

- WGeff = (N−1) × SPAC
- N is the # of BTS stripes

FIG. 6 A $$4 \times \sigma_{P\_Pocket} = (q \times \mu_h \times NA) \times \frac{Wp \times tsi}{SPAC} \times 4$$

$$\sigma_{P\_Pocket} = (q \times \mu_h \times NA) \times \frac{Wp \times tsi}{SPAC}$$

APPROACH FOR AN AREA-EFFICIENT AND SCALABLE CMOS PERFORMANCE BASED ON ADVANCED SILICON-ON-INSULATOR (SOI), SILICON-ON-SAPPHIRE (SOS) AND SILICON-ON-NOTHING (SON) TECHNOLOGIES

BACKGROUND OF THE INVENTION

Complimentary-Metal-Oxide-Semiconductor (CMOS) circuits designs based on the advanced Silicon-On-Insulator (SOI) technology are continuously proving to be better match to Gallium-Arsenide (GaAs) for the compact Radio-Frequency (RF) building-blocks. CMOS can be very densely integrated into Chips that it is the only known technology today that can monolithically integrate the RF modules and Power-Amplifiers (PAs) with the digital basebands. Such integration of RF transceivers and baseband processors in one compact chip is already gaining wide momentum as its demand in the industry is continuing to increase with the continuous growth of the High-Speed Downlink Packet Access (HSDPA)-enabled networks, and the continuous requirements for higher data throughput. This is simply due to the continuous on-going scale-up of the multimedia Cellular applications and that are only projected to further increase with the recent surge of the Internet-Of-Things (IOT). Yet much of the reason that is still impeding the implementations of the conventional CMOS into the mainstream PAs and other RF modules is their relatively lower currents and reduced bandwidths as compared to GaAs devices. These devices profit from a higher carrier Mobility that is boosting their currents and their bandwidths. The Fully-Depleted Silicon-On-Insulator (FD-SOI) MOS offers an excellent suppression of the junction capacitances, and has an inherently lower Threshold-Voltage (VT) as compared to the conventional MOS on bulk substrates. This gives it the good leverage it needs against the less matured GaAs technology in current and in bandwidth. CMOS based on SOI can realize speed and bandwidth based on this suppression of the junction capacitances with a Buried-Oxide film (BOX). Additionally, this same suppression of the junction capacitances suppresses the junction leakage and results in reduced overall parasitic power consumption.

One major obstacle and that is the Floating-Body-Effect (FBE) is still issue that is preventing this SOI MOS from scaling to larger peripheries to meet requirements for the high currents that the analog RF Cellular PAs require. These requirements were well described by Ted Johansson, Senior Member, IEEE, and Jonas Fritzin, Member, IEEE, "A Review of Watt-level CMOS RF power amplifiers", *IEEE Transactions on Microwave Theory and Techniques*, vol. 62, iss. 1, pp. 111-124, December 2013. This obstacle arises simply because both, higher Drain biasing (VD) and higher current ($I_{Device}$) increase the undesired Impact-Ionizations current (II-current) that governs the FBE, and structures with large peripheries do naturally deliver higher currents in proportion to the size of their "effective" Gate-Widths (WGeff). Accurate model for Impact-Ionizations current was described by X. Gu, G. Gildenblat, G. Workman, S. Veeraraghavan, S. Shapira and K. Stiles, "A Surface-Potential-Based Extrinsic Compact MOSFET Model", *Technical Proceedings of the* 2003 *Nanotechnology Conference and Trade Show*, vol. 2, pp. 364-367, San Francisco, February 2003.

The physical mechanism that governs the FBE was well detailed by Vandana B., "Study of Floating Body Effect in SOI Technology", *International Journal of Modern Engineering Research*, vol. 3, iss. 3, pp. 1817-1824. June 2013. FBE is mostly inherent to the SOI N-type MOS (NMOS) device and it manifests itself in Partially-Depleted Silicon-On-Insulator (PD-SOI) NMOS with build-up of positively charged Holes in P_Body that are generated from Impact-Ionizations at the Drain's edge of the device and which, for fixed Gate bias, continue to accumulate with increasing Drain Supply-voltage till they sufficiently lower the barrier under the channel between P_Body and Source and start to abruptly diffuse to Source causing an up-tick of the $I_{Device}$. This latches-up the built-in parasitic Bipolar structure from which the device will no longer turn-off, even after the Gate voltage is brought back to values lower than VT. This up-tick of current (or the "kink-effect", as is often referred to in technical literatures) is totally undesirable as it causes a distorted linearity of the RE PAs, a degraded overall device performance, a reduced signal-to-noise ratio, and can result in false outputs from Logic Gates. While this kink-effect is generally absent in the more advanced FD-SOI NMOS, because this device operates with its Body/Source barrier already lowered due to the inherent full-depletion of its Body, it still does exhibit the Bipolar latch-up and is more susceptible to it since it takes less Impact-Ionizations current to more strongly forward-bias an already lowered barrier. This FBE mechanism is therefore the source to the obstacle that is preventing the scaling of SOI CMOS to larger peripheries. This is due to the resulting inherent higher Impact-Ionizations of these structures from their inherent higher $I_{Device}$.

The use of multi-legs (or multi-fingers) design that decomposes a large-periphery structure into dozens, hundreds or potentially thousands of paralleled transistors of smaller Gate-Widths may deliver the desired high $I_{Device}$ while still suppressing the FBE due to a lower current per leg (or per finger). Such large-periphery multi-legs design is however well known to substantially increase the parasitic capacitances and reduce the device bandwidth. Its effect on increasing parasitic capacitances and reducing bandwidth in conventional MOS was well evidenced and reported by Kwangseok Han, Jeong-hu Han, Minkyu Je and Hyungcheol Shin, "RF Characteristics of 0.18-µm CMOS Transistors", *Journal of the Korean Physical Society*, vol. 40, no. 1, pp. 45-48, January 2002. The device bandwidth was shown in this work to dramatically collapse in proportion to the increase of the total number of its paralleled legs. Its ft collapsed from 80 GHz to 55 GHz with the increase of the number of its paralleled legs for same WGeff from 20 legs to 160 legs. This is attributed to the increases of the parasitic Gate-to-Body, Gate-to-Source, and Gate-to-Drain capacitances with this increase of the total number of paralleled legs. Multi-legs large peripheries MOS designs based on the SOI can be no exception to a similar trend, simply because of a similar increase of their parasitic capacitances. Furthermore, it was specifically shown that the use of multi-legs designs based on FINFETs does further amplify this reduction of the device bandwidth. That is simply because of the three-dimensional nature of the FINFET that tends to inherently increase its parasitic capacitances. Comparative assessments between planar SOI MOS and FINFETs clearly demonstrated this effect on the device performance. These assessments were carried by Jean-Pierre Raskin, "SOI Technology: An Opportunity for RF Designers?", *Journal of telecommunications and Information technology*, no. 4, pp. 3-17, April 2009; and by J. Borrernans, B. Parvais, and M. Dehan, "Perspective of RF Design in Future Planar and FINFET CMOS", *Radio frequency Integrated Circuits Symposium*, pp. 75-78, Atlanta Ga., 2008. Therefore, while it is indisputable today that the FINFET device does possess the excellent potential enabling it to comply with the downscaling requirements of the ITRS for logic operations (Ion/Ioff) its potential in the analog RF appears less promising.

Higher current devices are also as important for low insertion-loss RF-switches, and for an enhanced overall performance on all the analog and digital Integrated-Circuits (ICs).

Based on the above, a best approach to achieve the desired high $I_{Device}$ and high bandwidth for the analog RF PAs based on SOI CMOS would be through the incorporation of planar designs that are totally free of FBE and utilize largest possible Gate-width per leg so to maximize the bandwidth. This may totally eliminate the need for multi-legs designs, or when extreme high currents are still essentials, it can still minimize the total number of legs required to meet the target device current while still boosting the bandwidth. The larger is the Gate-width per leg, the less paralleled legs will be required to meet the target $I_{Device}$, and consequently, the higher becomes the operational bandwidth. Still, due to their high current per leg (or per finger), large peripheries SOI MOS structures that incorporate a large Gate-width per leg do still suffer from FBE and Bipolar current latch-up. Particularly most susceptive to this notorious FBE are the ICs that depend on relatively high Supply-voltages (>3.3V) for their normal operating modes. These tend to typically encompass longer Gate-Lengths to accommodate such high voltages to their Drains. Some of those ICs are in Cellular handheld devices and other portable electronics. Again, this is simply because of the fact that not only the WGeff in SOI-based CMOS dictates the amount of II-current that governs the FBE, but also the magnitude of its Supply-voltage (VD) and that of its Front-Gate bias (VGS). Such ICs include the Cellular RF PAs and some other analog modules such as the RF-switches, regulators and power-management ICs.

Figure 1:
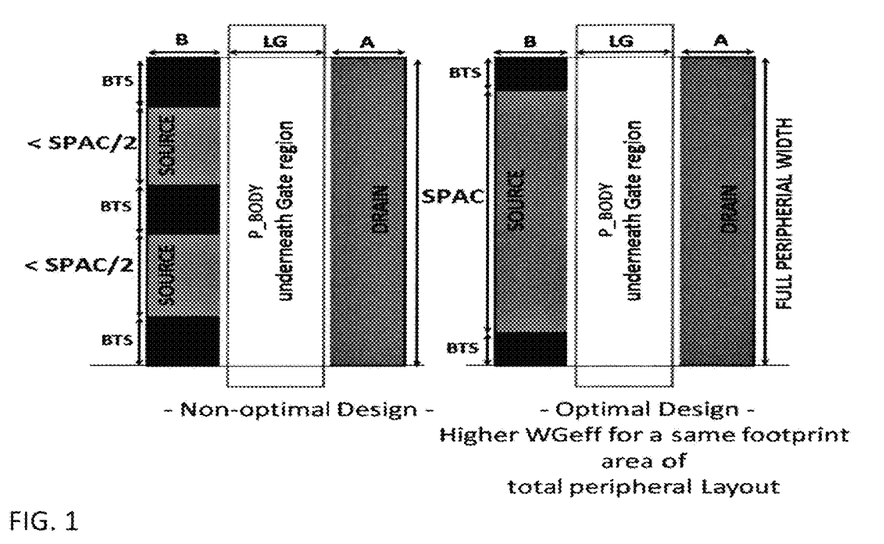
FIG. 1: Comparative "drawn" schematics illustrating the comparison between one non-optimal layout of an SOI-NMOS (left-hand side) versus an optimized layout design (right-hand side) of a same device. The non-optimal design used extra unneeded BTS area to meet targeted electric specifications with a fully suppressed FBE; the optimized design used on the other hand minimum possible BTS area for an equal suppression of FBE at same electric specifications and same total peripheral layout area. The WGeff in the optimized design is higher and so are its drive current and speed.

The most effective technique that is in use today to circumvent this kink-effect and the Bipolar current latch-up in single-legged SOT MOS, is through the incorporation of a Body-Tied-Source (BTS) within the Device layout. This BTS consists of no more than highly doped region(s) within the device layout structure, that is/are doped counter to the doping of the Source and Drain, and that is/are wired to the Source with Nickel- or Cobalt Silicide. This BTS allows the bulk of the II-current in the device Body to sink-out to it. It reduces therefore the amount of Holes in an NMOS that can diffuse from Body to Source and latch-up the parasitic Bipolar structure. The pitfall of this technique however is that it reduces the WGeff of the device, and correspondingly, its $I_{Device}$ for given full peripheral width (WG) of device structure. The capability of a BTS to reduce this Bipolar current gain in FD-SOI MOS was demonstrated by K. Hirose, H. Saito, S. Fukuda, Y. Kuroda, S. Ishii, D. Takahashi, and K. Yamamoto, "Analysis of Body-Tie Effects on SEU Resistance of Advanced FD-SOI SRAMs Through Mixed-Mode 3-D Simulations", *IEEE transactions on Nuclear Science*, vol. 51; mo. 6, pp. 3349-3353, December 2004. FIG. 1 illustrates this fact in showing side by side two comparative layout schematics of SOI-based NMOS structures: One optimized layout (right-hand side) that is capable of suppressing FBE for given bias with minimum area consumed by BTS. And, another un-optimized layout (left-hand side), of same full peripheral width (WG), that used extra BTS area that is not actually needed to suppress the FBE for same bias. The optimized layout gives higher WGeff, and does correspondingly give superior device performance manifested with higher current for same bias and same peripheral footprint; it is more area-efficient.

As more large peripheries devices get integrated monolithically to form functional ICs, summative or total combined parasitic area from BTS alone can become substantially large. Consequently, a tremendously large die-size can result unless area consumed by BTS within each single MOS device gets minimized relative to the device targeted performance (optimizing the performance for area-efficiency). The other alternative would be to rely on devices built with hundreds or potentially thousands of multi-legs structures of narrower Gate-widths (≤0.5 μm) having no BTS; however and as was already stated, this causes severe hit on the bandwidth.

If for instance through effective optimization, a1 μm² of BTS area in an SOI NMOS gets reduced by 40%, the device will benefit from gaining 40% increase in its drive current for same WG. Conversely, this WG can be reduced by 40% for a same drive current. In an IC containing 2000 SOI NMOS, a corresponding 800 μm² reduction in its total peripheral layout would then result for same or better performance. These are serious improvements in area-efficiency and in performance that cannot be overlooked.

Similar to SOI, Silicon-On-Sapphire (SOS) utilizes Sapphire ($Al_2O_3$) as the buried film instead of BOX to suppress the junction capacitances. The Silicon-On-Nothing (SON) process on the other hand allows the buried dielectric, which may still be a dielectric but can also be an air gap, to locate only underneath the Gate and the spacers regions of the device. It still maintains the desired coupling between the Front-Gate and the Back-Gate (a "must" criterion in FD-SOI MOS). The "claimed" advantage of this SON structure over SOI and SOS is in its reduced series resistance, and in its lessened self-heating due to less volume consumed by BOX or sapphire. Both of these two technologies, the SOS and the SON, are equally susceptible to the FBE, and do both possess the exact same obstacle as SOI to the scalabilities of their devices to larger peripheries.

BRIEF SUMMARY OF THE INVENTION

The invention forces a distinctive functionality in new and innovative device structures for single-legged SOI MOS that ensures their operation at any high bias (below Breakdown) through an adequate suppression of their built-in parasitic Bipolar structures, and with best area-efficiency of their layouts (with minimized BTS area relative to the device targeted performance). This functionality is fully scalable to the structures of very large peripheries and that operate at very high currents and with high II-currents.

This distinctive functionality is specifically realized through designing (or constructing) between Body (P_Body in case of an NMOS) and the BTS a highest possible conductance that can correspondingly filter to BTS highest possible II-current. This consequently results in lowest possible voltage-drop (Vdrop) between the Body and the BTS from this II-current. This allows the device to operate at its highest possible bias without activating its parasitic Bipolar current.

This highest possible conductance is in turn constructed with a very highly P-doped pocket (in case of an NMOS) that interfaces on its one side the full peripheral width of the structure while it junctions the Source on its opposite side. This higher doping of this pocket (P_Pocket) relative to P_Body imposes hard barrier for II-current in P_Body to laterally diffuse through this junction and forces it to conduct instead through this P_Pocket along the much wider WG that optimally connects to very narrow stripe(s) of BTS and result in this highest conductance between P_Body and BTS. The very narrow stripe(s) of BTS is essential for area-efficiency as the Silicon volume from BTS does not contribute to device current.

It is applicable to both the FD-SOI, and the PD-SOI. It is totally valid for SOS and SON as the physical mechanism to this distinctive functionality confines only to the top Front-Silicon surface of the device. It is fully scalable with varying peripheral Gate-widths, and with varying Gate-lengths. It was validated with TCAD simulations and was experimentally tested on a 0.18 µm-CMOS process.

Related findings were presented at the 2015 IEEE Topical Symposium on Power Amplifiers for Wireless Communications in San Diego, Calif. Conference was hosted at the University of California San Diego (UCSD).

BRIEF DESCRIPTION OF THE SEVERAL VIEWS OF THE DRAWINGS

FIG. 2A: Top view schematic of a proprietary single-legged SOI-NMOS device architecture that is being claimed in this patent. It ensures highest possible conductance between P_Body and BTS for given device periphery layout. This highest conductance is realized through the implantation of very highly conductive channel or canal (P_Pocket) that interfaces on its one side the full peripheral width of the structure while it junctions the Source on its opposite side. This higher doping of this pocket (P_Pocket) relative to P_Body (generally one- to two-orders higher) imposes hard barrier for II-current in P_Body to laterally diffuse through this junction and forces it to split instead into paralleled paths and conduct to the narrow BTS stripe through this P_Pocket along the much wider WG. These paralleled paths for II-current double the equivalent conductance between P_Body and BTS for given WG. A narrow WB is essential for area-efficiency as the Silicon volume from BTS does not contribute to device current. Smooth corner-rounding of the BTS edges suppresses current-crowding and boost the equivalent conductance. Gate, its dielectric, and Spacers regions are not shown. Gate and its dielectric are shown in the side views of FIG. 3 A, FIG. 3 B and FIG. 3 C that further describe this same singled-leg SOI MOS device structure. The "LG" symbolizes the Gate-Length.

FIG. 2B: Schematic illustrating the conductive path for Impact-Ionization current in the device structure of FIG. 2 A. The II-current in P_Body sees the equivalence of two-times the conductance of the highly doped P_Pocket due to this optimum positioning of the BTS along the WG.

FIG. 3 A: "Cartoon" schematic showing the corresponding Front view of the same claimed proprietary architecture of FIG. 2 A based on either the SOI or the SOS. The spacers on both lateral ends of the Gate are not being shown; they can be same as in any standard CMOS process. The view is perpendicular to the conducting inversion channel. (Back view is similar).

FIG. 3 B: "Cartoon" schematic showing the Side view from the Source side of the same claimed architecture of FIG. 2 A based on either the SOI or the SOS.

FIG. 3 C: "Cartoon" schematic showing the side view from the Drain side of the same claimed proprietary architecture of FIG. 2 A based on either the SOI or the SOS.

FIG. 6 A: Top view schematic of another proprietary single-legged SOI-NMOS device that is also being claimed in this patent. It similarly splits the Impact-Ionizations current through Pocket into two paralleled paths that ensure similar highest conductance between Body and BTS for given WG. Its minor drawback compared to the layout of FIG. 2 A is that it requires one additional BTS stripe for a same WGeff. Its advantage is that it does conduct device current toward the center of its WG where the defects density tends to be naturally lower. Gate, its dielectric, and Spacers regions are not shown. Gate and its dielectric are shown in the side views of FIG. 7 A and FIG. 7 B. Its side view on the Drain side is same as that of FIG. 3 C.

FIG. 6 B: Schematic illustrating the conductive path for Impact-Ionization current in the device structure of FIG. 6 A. The II-current in P_Body sees the equivalence of two times the conductance of the highly doped P_Pocket due to another optimum positioning of the BTS along the WG.

FIG. 7 A: "Cartoon" schematic showing the corresponding Front view of the same claimed proprietary architecture of FIG. 6 A based on either the SOI or the SOS. The spacers on both lateral ends of the Gate are not being shown; they can be same as in any standard CMOS process. The view is perpendicular to the conducting inversion channel. (Back view is similar).

FIG. 7 B: "Cartoon" schematic showing the Side view from the Source side of the same claimed architecture of FIG. 6 A based on either the SOI or the SOS.

Key concept in our guided design approach is that it maintains for the targeted (desired) electric specifications such summative total area consumed by BTS to a very minimum while effectively suppressing the FBE.

DETAILED DESCRIPTION OF THE INVENTION

Figure 2:
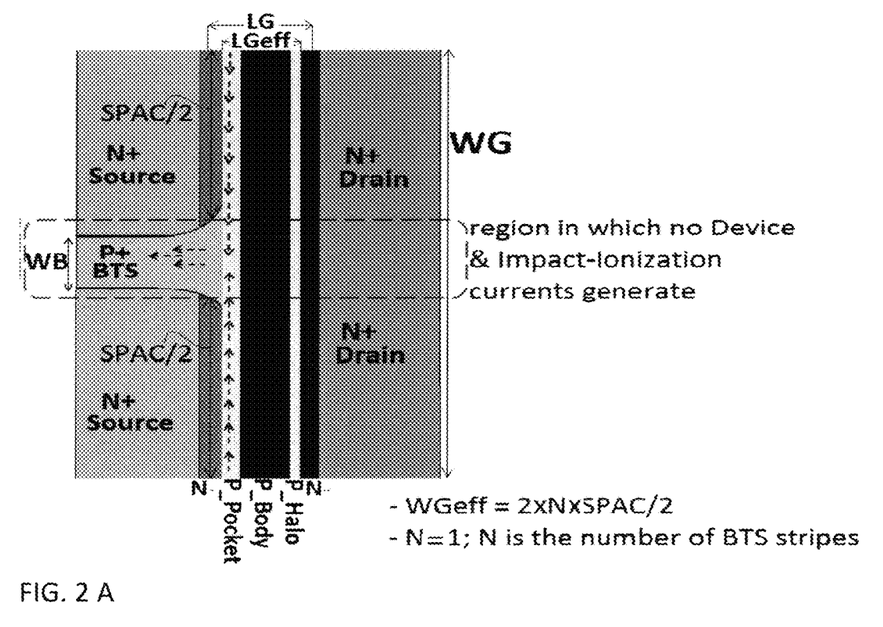
Figure 3:
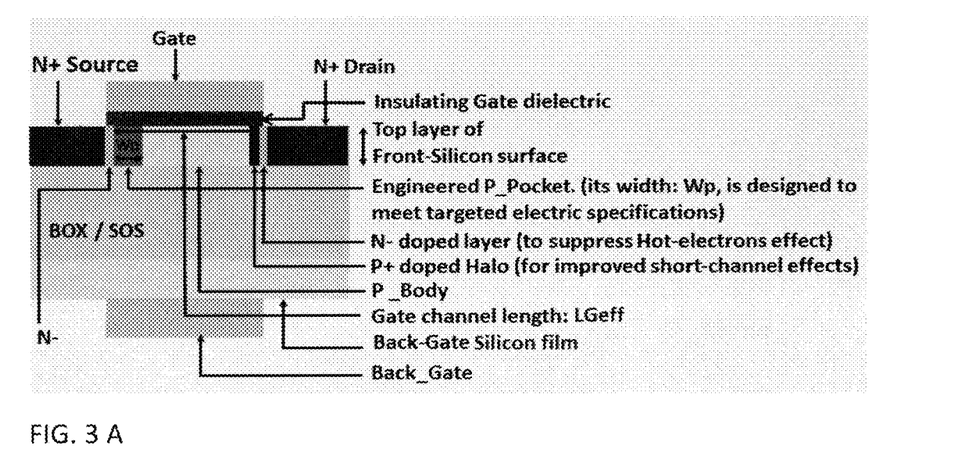

A top-view of such device layout is depicted in FIG. 2 A. Further schematics describing its structures are shown in FIG. 3 A, FIG. 3 B, and FIG. 3 C. The P Pocket extends into the "effective" Gate-Length of the device (LGeff) a distance: Wp that by default can be no more than ⅓×LGeff. This ensures the P_Pocket to be conductive with no stiff penalty on the device VT. A tighter or a more loose constraint may always be set for the specific application. As is shown with the dashed-arrows in FIG. 2 A, the device structure splits the II-current that generates around its Drain's edge into two equal magnitudes that converge through separate paths to the BTS while conducting in P_Pocket. The dashed-rectangle in same figure shows region within the device structure that does not conduct device current, and no consequent Impact-Ionizations occur within it either in following the II-current model described by X. Gu et al.;

$$II-\text{current} = I_{device} \times \left[\frac{\alpha}{\Omega} \times (VD - \Gamma \times Vknee) \times e^{-\frac{lm \times \Omega}{VD - \Gamma \times Vknee}}\right].$$

α, Ω, lm and Γ are parametrization constants. A lateral device current needs to conduct through this region to kick Impact-Ionizations, and which it does not. This also reduces the portion from WG that conducts device current to WGeff=(N+1)×SPAC=2×SPAC (N is the number of narrow stripes used for BTS. N=1 in FIG. 2 A), with $$SPAC \approx \frac{WG - WB}{2}.$$

WB is the width of the very narrow BTS stripe(s) that interface(s) the P_Body along the WG. As is intuitive from the above equation, the II-current does increase with WGeff since the $I_{device}$ increases with WGeff. Part of the II-current conducts through this P_Pocket while its other part leaks through the lateral junction between Body and Source. The corresponding equation for the currents-balance from Kirchoff-Current-Law (KCL) is:

$$\frac{II-\text{current}}{N+1} = \frac{I_{Bipolar}(Vdrop)}{N+1} + Vdrop \times \sigma P\_\text{Pocket}.$$

Vdrop is the voltage-drop in P_Pocket from the portion of II-current that conducts through it. $\sigma_{P\_Pocket}$ is the conductance of P_Pocket on each side of the BTS. Its analytic model from simple device Physics is:

$$\sigma P\_\text{Pocket} = \frac{1}{\rho} \times \frac{area}{length} = (q \times \mu_h \times NA) \times \frac{Wp \times (tsi - Deplmax)}{SPAC} \quad (1)$$

q is the electron-charge unit, $\mu_h$ the Hole-Mobility in P_Pocket, and NA the doping concentration in this P_Pocket.

The above expression for $\sigma_{P\_Pocket}$ does not account to the effect of lateral depletion in P_Pocket since a lightly doped region at Source (N−) absorbs most of this junction depletion. The expression still accounts nonetheless to the impact of the transversal depletion in P_Pocket while considering the worst-case scenario through which that P_Pocket strongly inverts. Expression for this transversal depletion is:

$$Deplmax = 2 \times \sqrt{\frac{\varepsilon tsi \times \varphi p}{q \times NA}},$$

with $$\varphi p = vth \times \ln\left(\frac{NA}{ni}\right).$$

∈tsi is the electric-dielectric constant of Silicon, and ni is the intrinsic carrier concentration of Silicon.

The expression for the KCL balance for currents can be rewritten as:

$$II\text{-current}=I_{Bipolar}(Vdrop)+Vdrop\times(N+1)\times\sigma_{P\_Pocket} \quad (2)$$

In substituting equation (1) into equation (2) it is obtained:

$$II-\text{current} = I_{Bipolar}(Vdrop) + \quad (3)$$
$$Vdrop \times (N+1) \times (q \times \mu_h \times NA) \times \frac{Wp \times (tsi - Deplmax)}{SPAC}$$

Equation (2) states that an equivalent conductance seen from the P_Body of the device of FIG. 2 A is: $(N+1)\times\sigma_{P\_Pocket}=2\times\sigma_{P\_Pocket}$. This compares to a conductance of:

$$\frac{\sigma P\_\text{Pocket}}{2}$$

if the BTS stripe was connected instead at the very edge of the WG in FIG. 2 A and with an exact same WGeff=(N+1)×SPAC=2×SPAC. That is an increase by factor of 4, simply from optimum positioning of the same BTS stripe along the WG for a same WGeff. Due to the finite magnitude of $\sigma_{P\_Pocket}$ at any given magnitudes for Wp, NA, $\mu_h$, and tsi, the structure of FIG. 2 A (with N=1) cannot Manage the high magnitudes of II-current from devices with very large peripheries while it still suppresses the parasitic Bipolar current.

Figure 5:
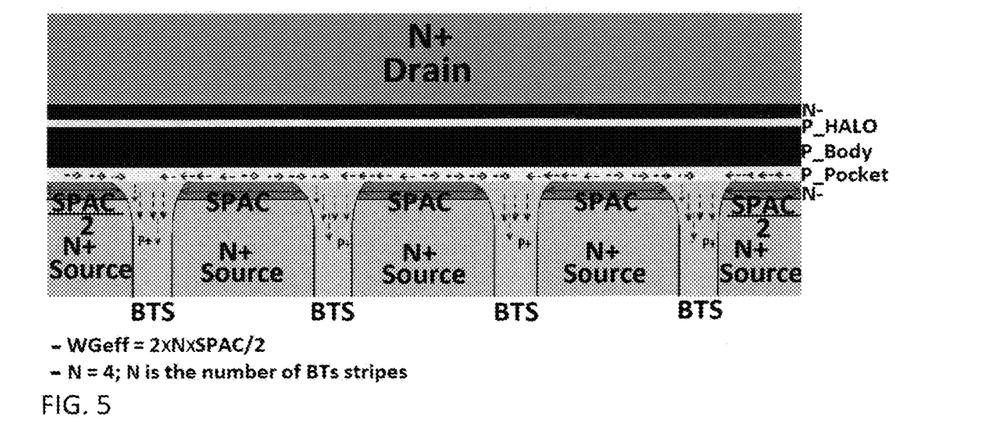
FIG. 5: An illustrative top-view layout of an optimized higher-current single-legged SOI-NMOS device that uses 4 BTS stripes for optimization. Its "effective" Gate width is: (4+1)×SPAC.Gate, its dielectric, and Spacers regions are not shown.

Significant Bipolar leakage will occur then. The fix is to array the device structure of FIG. 2 A along its Z-axis with added BTS stripes in-between structures. This will further split the II-current among mote paralleled structures of same $\sigma_{P\_Pocket}$. The equivalent conductance seen from P_Body for the arrayed structure will still scale in proportion to: $(N+1) \times \sigma_{P\_Pocket}$. A schematic for such an arrayed structure is shown in FIG. 5. With N=4, and WGeff=5×SPAC. Equivalent conductance seen from P_Body scales to $5 \times \sigma_{P\_Pocket}$.

Key criterion is to design for largest possible SPAC at fixed magnitudes of WGeff, WB, tsi, Wp, and a tolerated magnitude for the Bipolar leakage due to II-Current from the given bias (a rule-of-thumb is to design this Bipolar leakage an order-of-magnitude lower than the $I_{Device}$). This large SPAC, along with the narrow WB stripe(s), is what ensures, at the given bias, the best area-efficiency for layout (such that WGeff is closest to WG), and the adequate suppression of the device built-in parasitic Bipolar structure.

The general procedure for the design is:
1—The required WGeff for the device to deliver its operating current target (its desired current) at its short-channel VT can be extracted in following the DC models for currents as described by Kwyro Lee, Michael Shur, Tor A. Fjeldly, and Trond Ytterdal, *Semiconductor Device Modeling for VLSI*, New Jersey: Prentice Hall, pp. 238-256, 1993.
2—Value for the $I_{Bipolar}$ (Vdrop) is affixed to a magnitude significantly lower than the $I_{Device}$ (e.g. one-order of magnitude lower), and one accurate model for the Bipolar current is used to extract the corresponding Vdrop magnitude to this affixed magnitude for the $I_{Bipolar}$ (Vdrop). One recommended model can be that described by Ben G. Streetman, *Solid State Electronic Devices*, 4$^{th}$ ed. New Jersey: Prentice Hall, pp. 244-247, 1995.
3—From the targeted (or desired) values for VD and $I_{Device}$ the II-current is then extracted for the specific WGeff from the Impact-Ionizations model described by X. Gu et al.

Note that for the accurate extractions of all of the WGeff, Vdrop, and II-current at the targeted (or desired) VD and $I_{Device}$, the utmost accurate parametrization constants reflecting on the specific fabrication-process must be utilized in the models for DC MOS currents, for Bipolar leakage, and for Impact-Ionizations.

Specifically-built test-structures on test-chips (or test-vehicles) are utilized for the accurate extractions of these parametrization constants for their models prior to utilizing the models. Same test-structures are also used to extract the $\mu_h$. It is highly critical to de-convolute the impact from Bipolar current on the II-current in the extractions of all the parametrization constants. For that purpose, all the extractions are done on test-structures of different peripheries and that are ultra-dense in their BTS stripes (they axe very area-inefficient, but their purpose is for no other than extracting precise values for models constants). This allows to accurately gauge magnitudes for II-current and the $I_{device}$ at the high biasing, independent of effect of the Bipolar.

The number of required stripes for BTS (N) and the required spacing(s) between stripes (SPAC) are then extracted iteratively from the system-model below:

$$II-\text{current} = I_{Bipolar} + Vdrop \times (N+1) \times (q \times \mu_h \times NA) \times \frac{Wp \times (tsi - Deplmax)}{SPAC}$$

$$WGeff = (N+1) \times SPAC$$

N is then rounded to its higher integer value.
Ratio: SPAC is adjusted to mirror the rounding of N.

Daghighi et al. recognized through his work on PD-SOI MOS: Arash Daghighi, Mohamed Osman, and Mohamed A. Imam, "An area efficient body contact for low and high voltage SOI MOSFET devices", *Solid-State Electronics*, vol. 52, iss. 2, pp. 196-204, February 2008, that the insertion of many more BTS stripes reduces the Body potential caused from Impact-ionizations and can alleviate the FBE and the Bipolar latch-up, which in may allow a degree of scale-up for larger WGeffs and currents. He failed to realize though that the added incorporation of very highly conductive channel/canal in the device Body, along its entire width, and that junctions the Source and ties all the BTS stripes together can dramatically reduce this Body potential to permit significant reduction of the BTS stripes required to maintain adequate suppression of the Bipolar effects. This would have consequently resulted in larger WGeff and higher current for same total peripheral area of layout (footprint). Such highly conductive channel/canal can be generally doped with two orders of magnitude higher than Body and will extend into it a distance no less than quarter, that of the Gate-length. This is what would have given the device its much superior conductivity toward the BTS stripes. Daghighi et al. did not realize either that his same device layout is not effective for the FD-SOI MOS as the high II-current will opt to shorten to the Source through the an already-lowered lateral barrier rather than to conduct to BTS through the very high resistivity of the fully-depleted Body.

Figure 4:
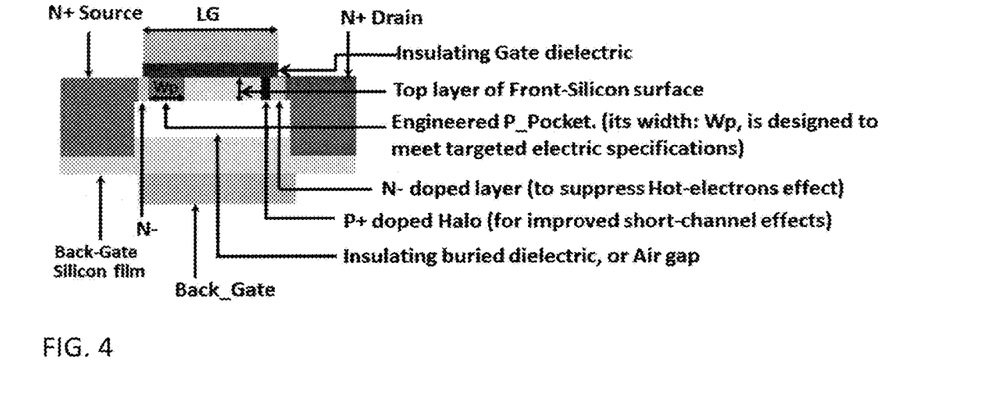
FIG. 4: "Cartoon" schematic showing the corresponding front view of the claimed proprietary architecture of FIG. 2 A, but based on SON, (the back view is similar). Its side views are similar to those of FIG. 3 B and FIG. 3 C, but without the "BOX/SOS" layer and with N+ Source and N+ Drain extending vertically to the Back-Gate Silicon film. Similarly, Spacers on both lateral ends of the Gate are not shown; they can be same as in any standard CMOS process.

Design that can be closest to the new innovative device structures that are introduced through this patent is that of U.S. Pat. No. 5,185,280 (Theodore W. Houston et al., US005185280A, FIG. 4 & FIG. 4a). This design accounts to the advantage of tying the BTS implant to Halo pocket, but fails to realize that for given WGeff there exists optimal configuration for BTS that best increases the equivalent conductance between P_Body and BTS. Consequently, the equivalent conductivity between the Body and the BTS in that design is significantly lower to what is obtained through the patented device structures in this application (by more than a factor of 4). Furthermore, the design in that patent does not entirely separate the whole Body region from the lightly doped Source region. Consequently, the conducting area of Halo to BTS is low, and so is the total equivalent conductance between P_Body and BTS. Additionally, the Holes from Impact-Ionizations tend to fail confining within. Halo and opt instead to follow a less resistive path through forward-biasing the weaker lateral junction between the LDD at Source and the Body.

Figure 6A:
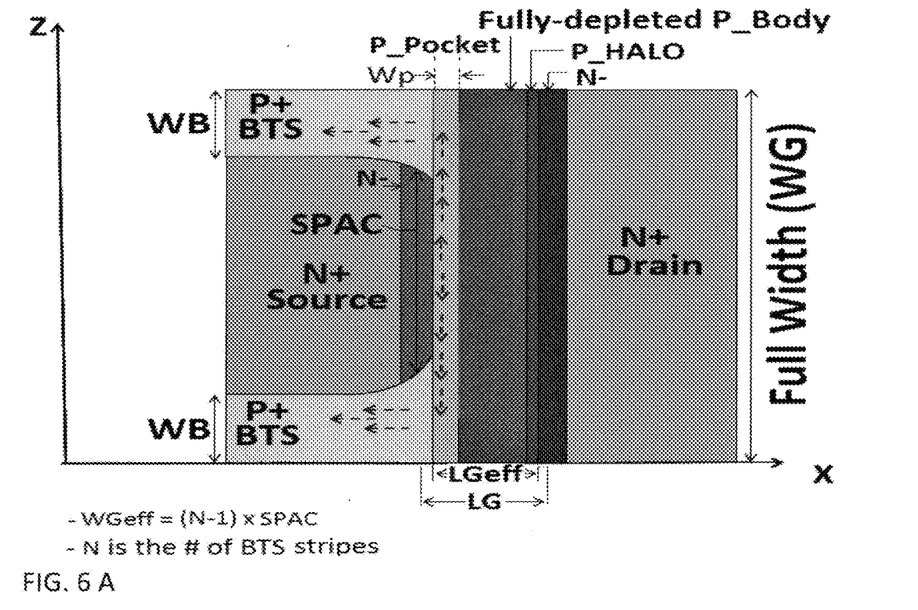
Figure 6B:
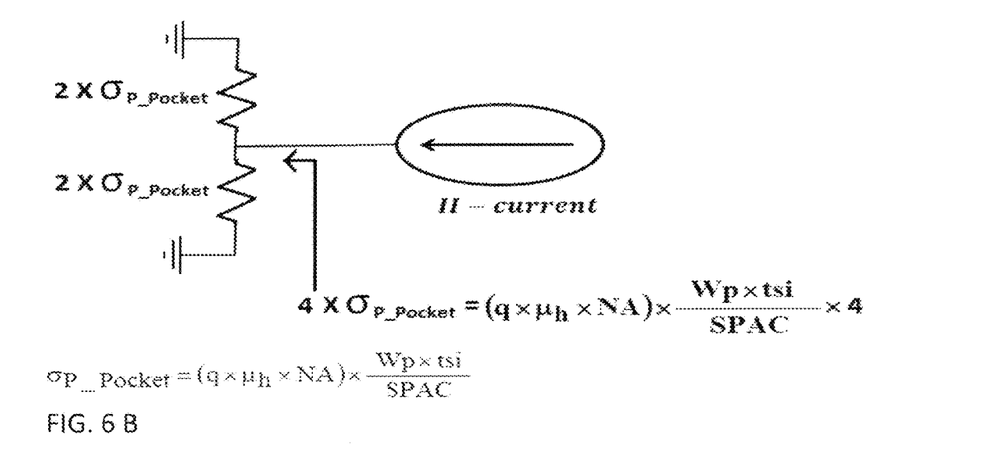
Figure 7A:
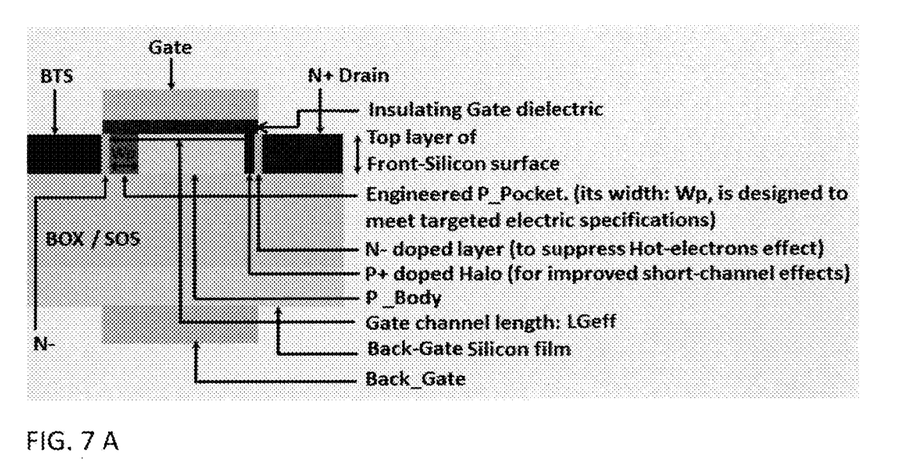
Figure 7B:
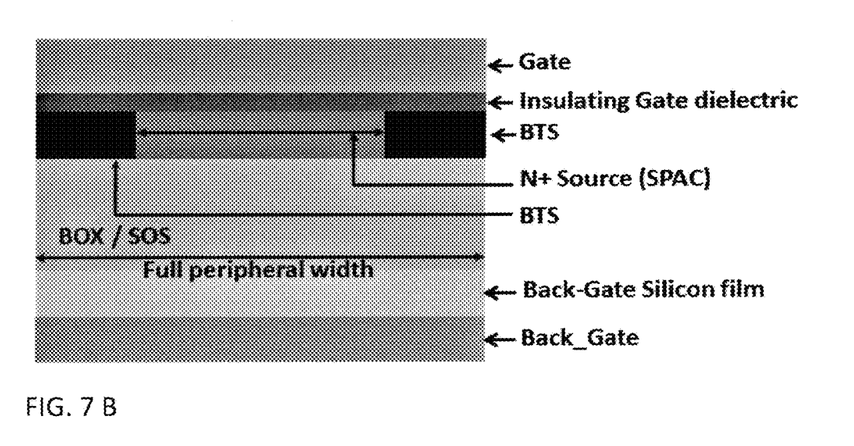
Figure 8:
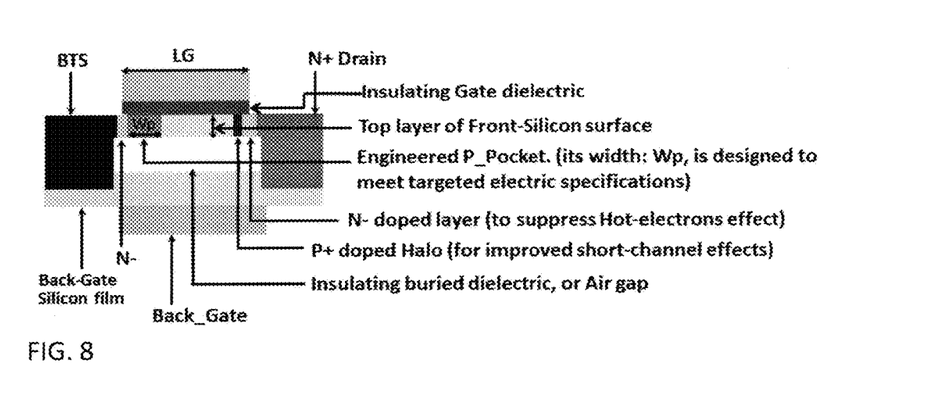
FIG. 8: "Cartoon" schematic showing the corresponding front view of the claimed proprietary architecture of FIG. 6 A, but based on SON, (the back view is similar). Its side views are similar to those of FIG. 7 B and FIG. 3 C, but without the "BOX/SOS" layer and with BTS and N+ Drain extending vertically to the Back-Gate Silicon film. Similarly, Spacers on both lateral ends of the Gate are not shown; they can be same as in any standard CMOS process.
Figure 9:
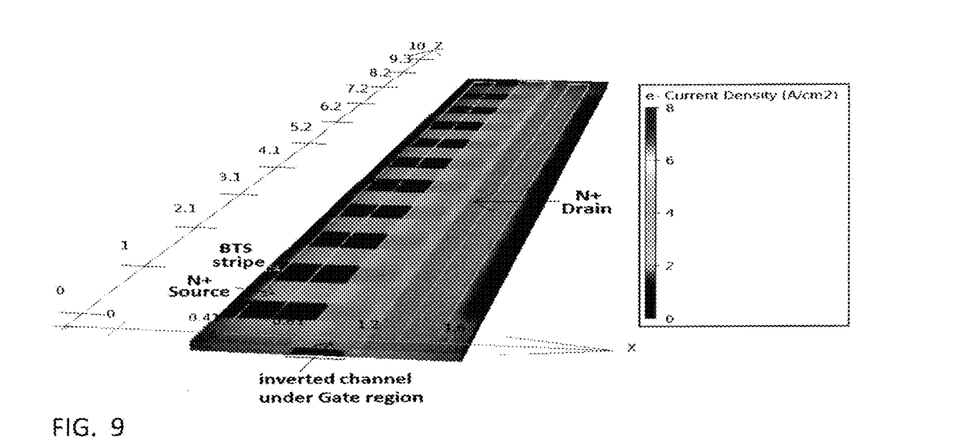
FIG. 9: A 3D TCAD simulation illustrating the impact of extra summative BTS areas on the WGeff in a large-periphery 1-leg FD-SOI NMOS. As more BTS area gets consumed within the total layout periphery of the device, the conductive path for electron current gets reduced, and therefore the effective Gate-Width (WGeff) of the device is also reduced. A total of eleven BTS stripes were utilized in that simulation.
Figure 10:
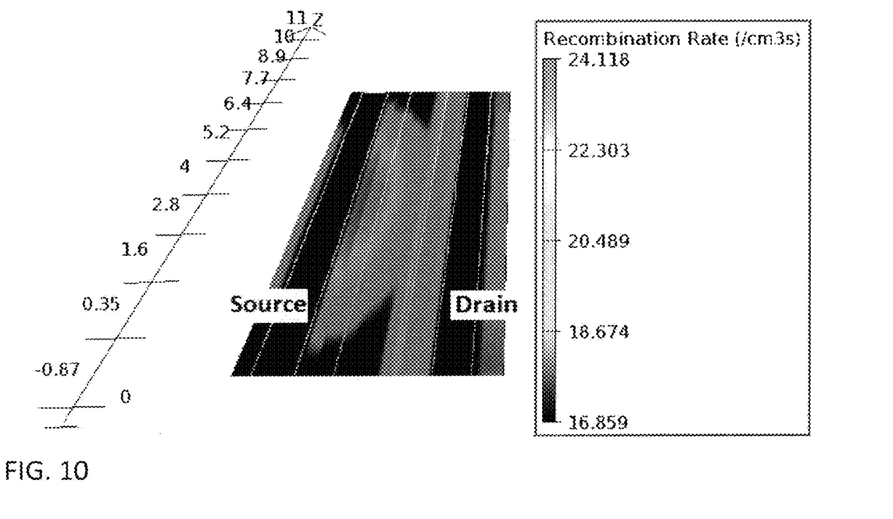
FIG. 10: A 3D TCAD simulation illustrating the parasitic Bipolar latch-up in an un-optimized large-periphery 1-leg FD-SOI NMOS based on the device structure of FIG. 6 A. Shown is $LOG_{10}$ of the Recombination Rate. As shown, Diffusion current is strongest toward the center between 2 BTS where the voltage-drop in P_Pocket due to the conducting Holes from Impact-ionization is highest, and so is the barrier lowering.

Another proprietary device structure for singled-legged SOI-NMOS is shown in FIG. 6A, FIG. 7 A, and FIG. 7 B. It results in same equivalent high conductance between P_Body and BTS as that of FIG. 2A, bits with different style connectivity of P_Pocket to BTS.

Figure 11:
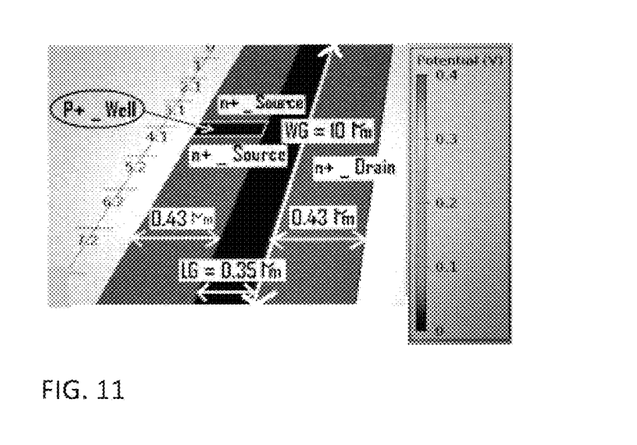
FIG. 11: Simulation of the Body potential in a fully optimized large-periphery 1-leg FD-SOI NMOS. It exhibited less than a 0.1V throughout its P_Body. The device was optimized in the back-accumulation mode (with an applied negative bias to its Back-Gate, in addition to the positive bias for inversion at the Front-Gate). WB=0.5 μm.
Figure 12:
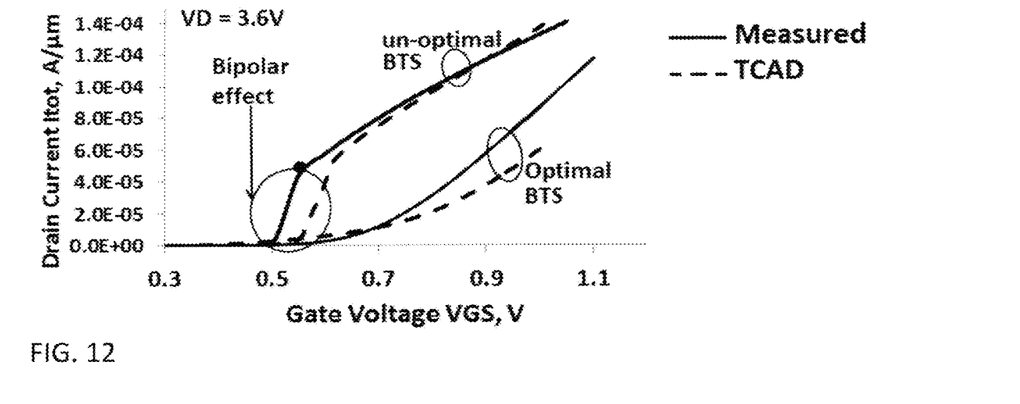
FIG. 12: Measured and simulated Current-Voltage transfer curves of FD-SOI NMOS devices (WGeff=9.5 μm; LG=0.35 μm; VD=3.6V; Box=0.5 μm; CFox—10 nm; tsi=35 nm; WB=μm). Clearly shown is the Bipolar effect in a device that failed to maintain a voltage drop throughout its P_Pocket that maintained effective suppression of the Bipolar current. The optimal device that effectively suppressed the Bipolar effect corresponds to that of the TCAD simulation in FIG. 11.
Figure 13:
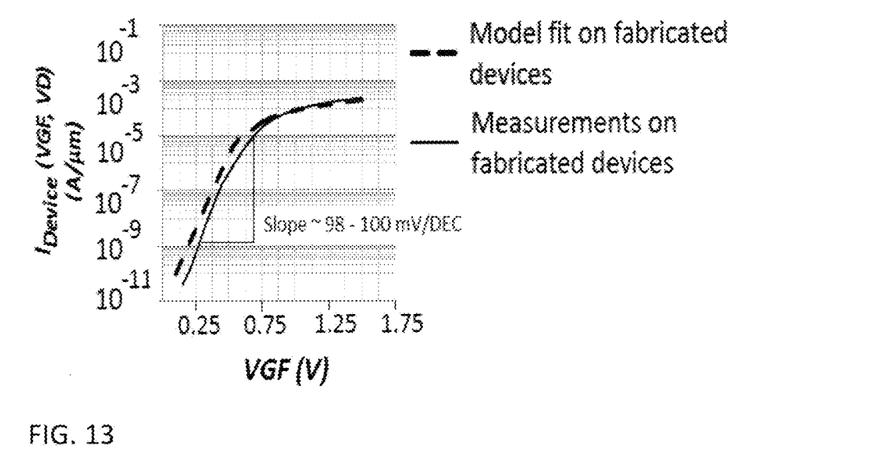
FIG. 13: Measured and simulated Subthreshold-Slope (SS), from 3D TCAD, in our optimized FD SOI NMOS (WGeff=2 μm; LG=0.35 μm; VDS=3.6V; Box=0.5 μm; tox—10 nm; tsi=35 nm). Its relatively high SS of 98 mV/Dec is caused from the effect of its highly doped P_Pocket. (Typical values for SS are: 65-80 mV/Dec with FD SOI; 80-120 mV/Dec with PD SOI; and ≥120 mV/Dec with bulk Si substrate).

Table 1 displays device parameters for the optimization performed on the device structure of FIG. 11 and FIG. 12 following the general design procedure described in this section. Table 2 shows the parameterization constants that were extracted from the specifically-built test-structures, and the design equations used from the models Additional models were used to account to the long-channel and the short-channel VTs. Model for the long-channel VT was taken from the work of Hyung-Kyu, student member, IEEE, and Jerry G. Fossum, Fellow, IEEE, "Threshold voltage of thin-film Silicon-On-Insulator (SOI) MOSFET's", *IEEE Trans. Electron Devices*, vol. 30, no. 10, pp. 1244-1251, October 1983. And, model to correct this VT for short-channel effects independently from the impact of II-current was taken from the work of Bin Yu et al., "Short-channel effect improved by lateral channel Engineering in deep-submicrometer mosfet's", *IEEE Trans. Elec. Dev.*, vol. 44, no. 4, pp. 627-634, April 1997.

TABLE 1

Process Parameters and the design optimization on FD-SOI MOSFET

| Processparameter | Value |
|---|---|
| Tsi, (nm) | 35 |
| Tox, (nm) | 9 |
| BOX, (nm) | 500 |
| LGeff, (nm) | 350 |
| Target Bias | |
| VGS | 0.8 |
| Optimization | |
| Wp (nm) | 24 |
| NB(cm$^{-3}$) | $4 \times 10^{17}$ |
| NA (cm$^{-3}$) | $8 \times 10^{19}$ |
| N- (cm$^{-3}$) | $5 \times 10^{19}$ |
| WGeff (μm) | 9.5 |
| VGB (V) | −0.8 |

TABLE 2

Design Equations and the "equation"-based design flow for optimization

Design Example
   // Sec. I - CONSTANTS:
Electric dielectric constant in space.
ϵo = 8.85 x 10$^{-12}$ (F/m)
Relative dielectric constant of Silicon.
ϵsi = 11.68
relative dielectric constant of Silicon Dioxide.
ϵox = 3.9
Default (or extracted) value for electron channel mobility.
μn = 1350 × 10$^{-4}$ (m$^2$/(V · s))
Default (or extracted) value for Hole mobility.
μh = 480 × 10$^{-4}$ (m$^2$/(V · s))
Default value for electron Saturation-Velocity.
vsat = 1e5; vsat = 10$^5$ (m/s)
Default values for parameters defining impact-ionization current.

$$\frac{\alpha}{\Omega} = 4 \times 10^5 \ (1/V)$$

lm × Ω = 50
Γ = 0.5
Workfunction at the front Gate (Default or extracted).
ϕ$_{MS}^f$ = −0.75 (V)
Workfunction at the back gate (default or extracted).
ϕ$_{MS}^b$ = 0.5 (V)
Intrinsic carrier concentration of Silicon.
ni = 1.5 × 10$^{16}$ (m$^{-3}$)
Thermal-Voltage at room temperature.
vth = 26 × 10$^{-3}$ (V)
Parasitic fixed charge density at the semiconductor and front Oxide interface.
Qff = 5 × 10$^9$ (1/m$^2$)
Parasitic fixed charge density at the semiconductor and BOX.
Qfb = 5 × 10$^{14}$ (1/m$^2$)
Electron charge unit.
q = 1.6 × 10$^{-19}$ (C)
Correction factor accounting to charging in BOX.
Corr = 0.8
   // Sec. II - Technology-node specific process parameters and dimensions:
Physical thickness of front Silicon film.
tsi = 35 × 10$^{-9}$ (m)
Physical thickness of BOX.
BOX = 0.5 × 10$^{-6}$ (m)
Physical thickness of front oxide.
tox = 9 × 10$^{-9}$ (m)
Effective Gate length or channel length.
LGeff = 0.35 × 10$^{-6}$ (m)
Effective Gate width.
WGeff = 2 × 10$^{-6}$ (m)
Constant capturing DIBL effect between technology nodes.
γ = 1.5

TABLE 2-continued

Design Equations and the "equation"-based design flow for optimization

// Sec. III - Design Equations for Calculation of threshold-voltage independent of short-channel effects.
Case-1: The Back-Surface of Front-Silicon film that interfaces the BOX is depleted:

$$\text{VTHO} = \phi_{MS}^{f} - \frac{q \times Qff}{CFox} + 2\phi B - \frac{q \times Nb \times tsi}{2 \times CFox} + \frac{\varepsilon o \times \varepsilon si}{tsi \times CFox} \times (2\phi B - \Psi sb) \quad \text{Eq. 1}$$

$$\phi B = vth \times \ln\left(\frac{Nb}{ni}\right)$$

$$CFox = \frac{\varepsilon o \times \varepsilon ox}{tox} \quad \text{Eq. 2}$$

$$\Psi_{sb} = \frac{CBOX}{CBOX + Cb} \times (V_{GB} - V_{GB,acc}) \quad \text{Eq. 3}$$

$$Cb = \frac{\varepsilon o \times \varepsilon si}{tsi} \quad \text{Eq. 4}$$

$$CBOX = \frac{\varepsilon o \times \varepsilon ox}{Corr \times BOX} \quad \text{Eq. 5}$$

$$V_{GB,acc} = \phi_{MS}^{b} - \frac{Qfb}{CBOX} - \frac{Cb}{CBOX} \times 2 \times \phi B - \frac{q \times Nb \times tsi}{2 \times CBOX} \quad \text{Eq. 6}$$

Case-2: The Back-Surface of Front-Silicon film that interfaces the BOX is inverted:
In that case the VGB in Eq. 3 is large enough to bring the $\Psi sb$ equaling $2 \times \phi B$, and the VTHO of Eq. 1 converges to:

$$\text{VTHO} = \phi_{MS}^{f} - \frac{q \times Qff}{CFox} + 2\phi B - \frac{q \times Nb \times tsi}{2 \times CFox} \quad \text{Eq. 7}$$

Case-3: The Back-Surface of Front-Silicon film that interfaces the BOX is accumulated:
At the onset of accumulation the $\Psi sb$ of Eq. 1 equals 0, and the VTHO converges to:

$$\text{VTHO} = \phi_{MS}^{f} - \frac{q \times Qff}{CFox} + 2\phi B - \frac{q \times Nb \times tsi}{2 \times CFox} + \frac{\varepsilon o \times \varepsilon si}{tsi \times CFox} \times 2 \times \phi B \quad \text{Eq. 8}$$

// Accounting to Short-Channel-Effects (SCE).
There exists a RollOff to the Threshold-Voltage due to DIBL effect, and a RollUp to it as well due to effect of HALO. Both become significant at the lower LGeff value.

VT = VTHO + RollOff (LGeff, VD) + RollUp(LGeff, VD)  Eq. 9

$$\text{RollOff(LGeff, VD)} = -[(\psi_0 - 2\phi B) + VD] \times e^{-\frac{LGeff}{lc}} \quad \text{Eq. 10}$$

$$\psi_0 = vth \times \ln\left(\frac{N^- \times NA}{ni^2}\right) \quad \text{Eq. 11}$$

$$lc = \sqrt{\frac{\varepsilon o \times \varepsilon si \times tox \times tsi}{\varepsilon o \times \varepsilon ox}} \quad \text{Eq. 12}$$

$$\text{RollUp(LGeff, VD)} = [K - 1] \times C2 \times e^{-\frac{LGeff}{2 \times lc}} \quad \text{Eq. 13}$$

$$K = \frac{Wp + WP\_HALO}{\gamma \times lc} \times \sqrt{\frac{\Psi S2 - \Psi S1}{VD}} \quad \text{Eq. 14}$$

$\Psi S2 = VFG - VTHO + 2 \times \phi B$  Eq. 15
$\Psi S1 = VFG - VTHOP + 2 \times \phi P$  Eq. 16

$$\text{VTHOP} = \phi_{MS}^{f} - \frac{q \times Qff}{Cof} + 2\phi p - \frac{q \times Nb \times xd}{CFox} \quad \text{Eq. 17}$$

$$\phi p = vth \times \ln\left(\frac{NA}{ni}\right) \quad \text{Eq. 18}$$

TABLE 2-continued

Design Equations and the "equation"-based design flow for optimization $$xd = 2 \times \sqrt{\frac{\varepsilon o \times \varepsilon si \times \phi p}{q \times NA}}$$ Eq. 19

$$C2 = 2 \times \sqrt{(\psi_0 - 2 \times \phi B) \times (\psi_0 - 2 \times \phi B + VD)}$$ Eq. 20

// The Threshold-Voltage of Eq. 9 is function of only 4 unknowns that are:
1. The Carrier concentration of P_Body: NB
2. The Carrier concentration of P_Pocket: NA
3. The carrier concentration of N- region: N-
4. The lateral dimension of P_Pocket: Wp All other parameters are defined in Sec. I & Sec. II.
// Sec. IV - Extracting the WGeff that meets the targeted saturated drive current at the targeted Front-Gate bias and VT.
Case-1: Drive current depends on Saturation-velocity due to the Short-Channel effect defined when $$\frac{vsat}{\mu e} \times LGeff \ll VGS - VT$$ Eq. 21

Then the WGeff is:

$$WGeff = \frac{ISat}{vsat \times CFox \times (VGS - VT)}$$ Eq. 22

$$VKnee = \frac{vsat}{\mu e} \times LGeff$$ Eq. 23

The Isat in Eq. 22 is the targeted Saturation drive current, and The VKnee of Eq. 23 is the device Knee-voltage between linear and saturated drive current.
Case-2: Drive current depends on low-field Mobility due to the relatively long LGeff. This occurs when the criteria of Eq. 21 is not met.

$$WGeff = \frac{2 \times ISat \times LGeff}{\mu e \times CFox \times (VFG - VT)^2}$$ Eq. 24

$$VKnee = VFG - VT$$ Eq. 25

Given that the ISat and the VT targets are defined and so is the VGS, and rest of process parameters are known, the WGeff is extracted either from Eq. 22 or from Eq. 24 depending on the magnitude of the LGeff.
// Sec. V - Determining the corresponding Body-Current (Ib) for the targeted ISatVFG and VDS. That is II-current.

$$Ib = ISat \times \left[ \frac{\alpha}{\Omega} \times (VDS - \Gamma \times VKnee) \times e^{-\frac{Im \times \Omega}{VDS - \Gamma \times VKnee}} \right]$$ Eq. 26

Ib is extracted from Eq. 26.

What is claimed is:

1. A single-leg Silicon-On-Insulator Metal-Oxide-Semiconductor (SOI-MOS) comprising;
   a highly P-doped pocket (P_pocket) that interfaces on one side the full peripheral width of the MOS structure while it junctions the source on the opposite side, the P_doped pocket has a higher doping relative to a P_Body, this higher doping can be one to many orders of magnitude higher,
   this arrangement imposes a hard barrier for an impact-Ionizations current in the P_body to laterally diffuse through this junction and forces it to conduct through the P_pocket along the wider peripheral width of the structure to new and distinct configurations of a body tied source (BTS) that connects to the P_pocket, these new configurations specifically split the impact ionization current (II-current) into parallel paths, increasing therefore the overall equivalent conductance between the P_Body and BTS;
   the lateral dimensions of the P_pocket are made to be relatively wide so to significantly increase its conductance, the P_pocket width (Wp) extends laterally no more than ⅓ of P-body width (LGeff),
   the BTS has corner-rounded dimensions that suppress current-crowding of the II-current and further increases the overall conductance between the P_Body and the BTS;
   higher Impact-Ionization (II-current) resulting from wider full peripheral width of this single-leg MOS device structure requires proportional scale-up of the equivalent conductance between the P_Body and BTS; this is accomplished through insertion of additional BTS stripes;
   the device layout area is most area-efficient, that is it possesses highest drive current for given WGeff, Bipolar leakage, and operating bias, when the number of its BTS stripes (N) and the spacing(s) between them conform to the model, $$II - \text{current} = $$
$$I_{Bipolar} + Vdrop + N \times (q \times \mu_h \times \text{conc}\_\partial) \times \frac{Wp \times (tsi - Depl\max) \times 4}{SPAC} \quad 5$$

$WGeff = N \times SPAC$; $N \geq 1$ is the number of BTS stripes from given value for suppressed Bipolar leakage ($I_{Bipolar}$) a corresponding magnitude for Vdrop is determined; the number of required stripes for BTS (N), and the required spacing(s) between them (SPAC) are then extracted for given II-current from the above model, the claim extends to devices fabricated on any buried dielectric beside the Silicon-dioxide, this includes Silicon-On-Sapphire (SOS), Silicon-On-Nothing (SON), and all the insulating substrates (e.g. flexible organic substrates).

\* \* \* \* \*